US007307581B2

(12) United States Patent
Sasada

(10) Patent No.: US 7,307,581 B2
(45) Date of Patent: Dec. 11, 2007

(54) MOUNTING STRUCTURE OF HIGH-FREQUENCY SEMICONDUCTOR APPARATUS AND ITS PRODUCTION METHOD

(75) Inventor: Yoshiyuki Sasada, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 135 days.

(21) Appl. No.: 10/871,054

(22) Filed: Jun. 21, 2004

(65) Prior Publication Data

US 2004/0239453 A1 Dec. 2, 2004

Related U.S. Application Data

(62) Division of application No. 10/245,724, filed on Sep. 18, 2002, now Pat. No. 6,771,150.

(30) Foreign Application Priority Data

Jan. 8, 2002 (JP) ............................ 2002-001296

(51) Int. Cl.
*G01S 13/491* (2006.01)
*H03B 1/00* (2006.01)
*G01S 13/93* (2006.01)
*G01S 13/00* (2006.01)

(52) U.S. Cl. ........................... 342/70; 342/82; 342/89; 342/175; 331/107 R; 331/107 DP; 331/96; 333/219; 333/219.1; 333/227; 333/230

(58) Field of Classification Search ............ 342/70-72, 342/175, 27, 28, 82-103, 118, 128-133; 331/96, 99, 107 DP, 107 R; 333/202, 219, 333/219.1, 230, 227; 701/300, 301
See application file for complete search history.

(56) References Cited

U.S. PATENT DOCUMENTS 4,307,352 A * 12/1981 Shinkawa et al. ............ 331/99

(Continued)

FOREIGN PATENT DOCUMENTS

EP 0 915 528 A 5/1999

(Continued)

OTHER PUBLICATIONS

*Millimeter-wave DRO with Excellent Temperature Stability of Frequency*, Takatoshi Kato et al, 29th European Microwave Conference—Munich 1999, pp. 197-200.

(Continued)

*Primary Examiner*—Bernarr E. Gregory
(74) *Attorney, Agent, or Firm*—Crowell & Moring LLP

(57) ABSTRACT

In a high-frequency circuit having a substrate having a high-frequency transmission line and an dielectric resonator formed on said substrate so that said dielectric resonator and said high-frequency transmission line may be coupled electro-magnetically to each other, a hole part or a cavity part is formed at a part of said substrate and a dielectric resonator is embedded in said hole part or said cavity part. In the same object, a high-frequency circuit having a dielectric resonator is produced by the step for forming a high-frequency transmission line on a substrate, the step for forming a hole part or a cavity part on a part of the substrate, and the step for mounting a dielectric resonator in the hole par formed on the surface of the substrate.

6 Claims, 8 Drawing Sheets

U.S. PATENT DOCUMENTS

| | | | | |
|---|---|---|---|---|
| 4,461,040 | A * | 7/1984 | Dobrovolny | 331/99 |
| 6,127,907 | A * | 10/2000 | Furuya et al. | 333/219.1 |
| 6,236,279 | B1 * | 5/2001 | Fujii et al. | 331/96 |
| 6,480,078 | B2 * | 11/2002 | Kim et al. | 333/219.1 |

FOREIGN PATENT DOCUMENTS

| | | |
|---|---|---|
| EP | 0 998 188 A | 4/2000 |
| JP | 62-179134 | 8/1987 |
| JP | 03-125501 | 5/1991 |
| JP | 10-031219 | 2/1998 |
| JP | 10-093219 | 4/1998 |
| JP | 10 093219 | 7/1998 |
| JP | 10-270936 | 10/1998 |
| JP | 2000-114828 | 4/2000 |
| JP | 2000-353639 | * 12/2000 |

OTHER PUBLICATIONS

*A novel millimeter-wave multilayer IC with planar $TE_{010}$ mode dielectric resonator*, Takatoshi Kato et al, 1998 Asia-Pacific Microwave Conference, pp. 147-150.

* cited by examiner

MOUNTING STRUCTURE OF HIGH-FREQUENCY SEMICONDUCTOR APPARATUS AND ITS PRODUCTION METHOD

This application is a divisional application of U.S. patent application Ser. No. 10/245,724, filed Sep. 18, 2002, now U.S. Pat. No. 6,771,150.

BACKGROUND OF THE INVENTION

The present invention relates to a high-frequency circuit having a built-in dielectric resonator and a oscillator using this high-frequency circuit, and their production method.

In a frequency processing circuit for the high-frequency region such as microwave and extremely high frequency wave, it is required to reduce the phase noise in order to stabilize the frequency characteristic of the oscillator. In addition, it is effective to increase the load Q factor of the oscillator in order to reduce the phase noise. For example, increasing the Q factor ten times can reduce the phase noise by 1/100.

Thus, using an dielectric material having a high Q factor for the material of the oscillator and shaping precisely the oscillator so as to have a desired resonant frequency, the adhesive agent with a low dielectric constant and a low dielectric loss is coated on another substrate so as to establish the electro-magnetic coupling of the resonator to the micro-strip transmission line formed on the surface connected to the oscillation part in high-frequency mode, or to the micro-strip transmission line formed on the surface of another substrate connected to the oscillation part in high-frequency mode, and then, the resonator is mounted precisely on the surface of another substrate by the precision mounter.

This kind of technology is disclosed, for example, "Millimeter-wave DRO with Excellent Temperature Stability of Frequency" in European Microwave Conference—Munich 1999, pp.197-200, and "A novel millimeter-wave multiplayer IC with planer TE010 mode dielectric resonator" in 1998 Asia-Pacific Microwave Conference, pp. 147-150.

As disclosed in Japanese Patent Laid-Open Number 10-31219 (1998), Microwave Monolithic Integrated Circuit having a built-in dielectric resonator is known. This is known as such a method that the resonator formed with a high Q factor dielectric material is embedded into the concave part formed on the surface of the substrate of the high-frequency integrated circuit.

In the prior art of the adhesive bonding method in which the resonator is bonded to the micro-strip transmission line connected to the oscillation part so as to establish the electro-magnetic coupling, there is such a problem that it is difficult to determine the shape of the resonator and its relative position to the micro-strip transmission line in order to satisfy the desired frequency and power as well as the designated phase noise.

As it is required that the precision for the geometrical dimension of the resonator to its designed target value is ±0.1% and that the precision for fixing the resonator to its designed position is ±5% of its geometrical dimension, as for the shape, it is necessary to trim the shape of the resonator by grinding the dielectric material, and as for the positioning, it is necessary to mount the resonator by the high-precision mounter, and thus, it has been difficult to operate the mass production and downsize the cost in production.

In the method disclosed in Japanese Patent Laid-Open Number 10-93219 (1998), as the device has such a structure as the integrated circuit, that is, MMIC accommodates the resonator, the size of MMIC is required to be larger than the size of the resonator. However, as the price per unit area of the materials such as GaAs used conventionally as the integrated circuit substrate in the high-frequency region is extremely high, it is difficult to produce the low-cost MMIC. In addition, as the dielectric constant in GaAs substrates is high as in about 13, its dielectric loss gets larger for the oscillator in which the resonator is embedded in the center of the substrate. In this case, as the Q factor as the oscillator is reduced due to the dielectric loss even in the fact of using the dielectric material with high Q factor for the resonator, there is such a problem that the expected effect of high Q factor is not attained.

SUMMARY OF THE INVENTION

An object of the present invention is to provide a mounting structure and a production method for the high-frequency semiconductor device which enables an easy and low cost production of the high-frequency circuit in which the trimming of the shape of the dielectric material by grinding work is not required and the relative position between the dielectric material and the high-frequency transmission line can be fixed in a good condition.

In order to attain the above object, in this embodiment, in a high-frequency circuit having a substrate having a high-frequency transmission line and an dielectric resonator formed on said substrate, said substrate has a hole part or a cavity part formed at the position in which said dielectric resonator and said high-frequency transmission line are coupled electro-magnetically to each other, and said dielectric resonator is embedded in said hole part or said cavity part.

Another aspect of the present invention is an oscillator using an external resonator, in which said external resonator has a substrate having a high-frequency transmission line and an dielectric resonator formed on said substrate so as to be coupled electro-magnetically to said high-frequency transmission line;

said substrate is formed by laminating a first dielectric layer and a second dielectric layer, both composed of low-dielectric constant, and said dielectric resonator is composed by using a dielectric material having a dielectric constant higher than a dielectric constant of a dielectric material of said substrate; and GND layer is formed on one surface of said first dielectric layer and said high-frequency transmission line is formed on the other surface of said first dielectric layer, and said second dielectric layer has said hole part formed at a position suited for making said dielectric resonator coupled electro-magnetically to said high-frequency resonator.

Another aspect of the present invention is an oscillator using an external resonator, in which and said dielectric resonator is composed by using a dielectric material having a dielectric constant higher than a dielectric constant of a dielectric material of said substrate;

said substrate is formed by laminating the first dielectric layer and the second dielectric layer, both composed of low-dielectric constant;

in the external resonator, said second dielectric layer is laminated on said first dielectric layer, a part of said first dielectric layer extends in the side direction to said second dielectric layer, and the first micro-strip transmission line formed in said first dielectric layer is exposed above the surface of said first dielectric layer; and said first micro-strip layer is converted into the first coplanar transmission line by the conversion part, and MMIC defining said oscillator forms the second coplanar transmission line.

Another aspect of the present invention is a production method of the high-frequency semiconductor device having a substrate having a high-frequency transmission line and a dielectric resonator embedded in said substrate so as to be coupled electro-magnetically to said high-frequency transmission line, comprising a step for forming said high-frequency transmission line on said substrate composed of a dielectric material, a step for forming a hole part or a cavity part partially at a designated position on said substrate suitable for making said dielectric resonator coupling electro-magnetically to said high-frequency transmission line, and a step for mounting said dielectric resonator into said hole part or said cavity part.

Another aspect of the present invention is a method for forming said dielectric resonator, in which said substrate is produced by printing method or lamination method, and furthermore, said hole part or said cavity part is formed in an dielectric layer forming said substrate by using a mask or a cutting die, and a solid solution of dielectric material having a dielectric constant higher than that of the dielectric material used in said substrate is printed and burned on said hole part or said cavity part.

Yet another aspect of the present invention is a method for forming said dielectric resonator, in which said hole part or said cavity part is formed in an dielectric layer forming said substrate by using a mask or a cutting die, an adhesive agent is made coated on said hole part or said cavity part, and the dielectric resonator having a dielectric constant higher than that of the dielectric material used in said substrate, followed by hardening process of said adhesive agent.

According to the present invention, it will be appreciated that a high-precision positioning between the dielectric resonator and the high-frequency transmission line can be made easier, and that high-performance oscillators having a stable frequency characteristic can be produced at a low price.

DESCRIPTION OF THE PREFERRED EMBODIMENTS

At first, for the first embodiment of the present invention, an external resonator, the structure of the oscillator using this resonator and its mounting method will be described below.

Figure 1:
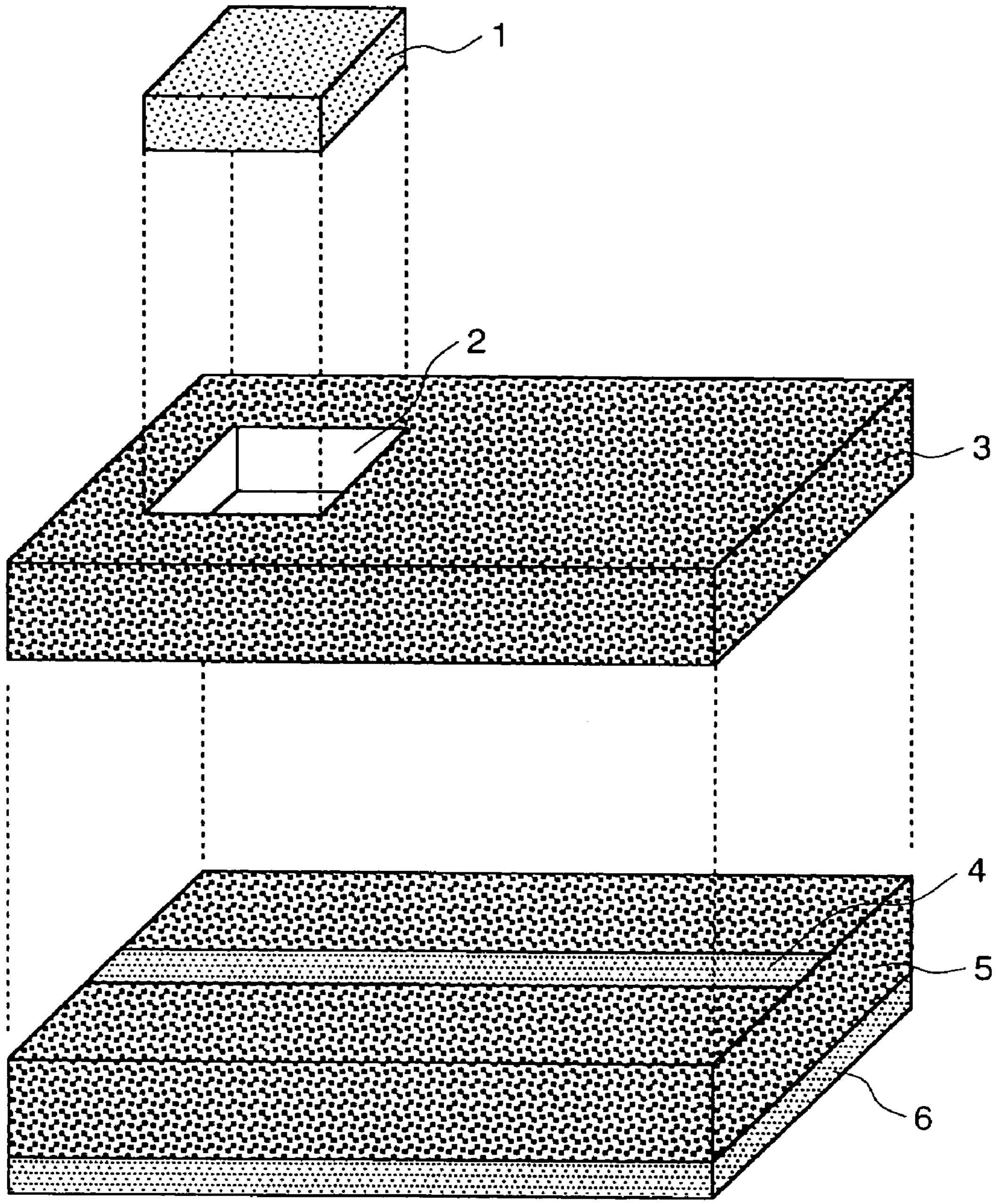
FIG. 1 is a perspective view illustrating the outline of the external resonator of the first embodiment of the present invention.

FIG. 1 is a perspective view illustrating the external appearance of the external resonator in the first embodiment of the present invention. The external resonator is composed of a couple of substrates comprising the first dielectric layer 5 and the second dielectric layer 3 laminated on the first layer, and the dielectric resonator 1. Both of the first dielectric layer 5 and the second dielectric layer 3 are composed of low dielectric constant material having a relative dielectric constant 10 or smaller. GND layer 6 composed of Ag/Pd, Ag, Au, Ag/Pt and the like is formed on one side of the first dielectric layer 5, and the transmission line 4 similarly composed of Ag/Pd, Ag, Au, Ag/Pt and the like is formed on the other side of the first dielectric layer. The hole part 2 is formed in the second dielectric layer 3, and the dielectric resonator 1 is mounted inside the hole part 2.

The hole part 2 is formed at such a suitable position that the dielectric resonator 1 to be mounted may be coupled electro-magnetically to the high-frequency transmission line 4, and is shaped so as to be matched to the outline of the dielectric resonator 1, for example, its plane form is defined to be a rectangle. It may be allowed a cavity is formed through the side section and the dielectric resonator 1 is mounted in this cavity instead of the hole part 2. It may be allowed to form a concave part having a bottom instead of the hole part 2.

The first dielectric layer 5 and the second dielectric layer 3 are formed as a single piece.

The dielectric resonator 1 is composed of a dielectric material, for example, having a relative dielectric constant around 35 and its material Q about 30000. The material for the dielectric resonator 1 is selected from the materials having a relative dielectric constant from 20 to 100.

For example, those materials include $Ga(Mg1/3Ta2/3)O_3$, $Ba(An1/3Ta2/3)\ O_3$, $(Ba, Sr)\ (Ga1/3Ta2/3)O_3$, $Ba(Mg1/2Nb2/3)O_3$, $Ba(Zn1/2Nb2/3)O_3$, $(Ba, Sr)\ (Ga1/3Nb2/3)\ O_3$, $Ba(Sn, Mg, Ta)\ O_3$, $Ba(Zr, Zn, Ta)\ O_3$, $(Zr, Sn)Ti\ O_4$, $BaTi_9O_{20}$, $BaO—PbO—Na_2O_3—TiO_2$. Alternatively, the material for the dielectric resonator is selected from at least one of the group of solid solutions of those materials.

As for the production method of the substrate, the printing method or lamination method is used. The printing method is simple and its facility requires a lower cost in comparison with the lamination method. On the other hand, in the lamination method, cutting dies of the green sheet are required for the individual layers which leads to the higher facility cost but the number of laminated layers can be made larger. The production method is determined by considering the advantageous aspects of the individual methods.

In case of producing the substrate by the lamination method, processed sheets made of unbaked ceramics, called “green sheet”, are die-cut by the punching machine, and then plural green sheets are made laminated and burned in application of pressure in order to produce a ceramics multi-layer substrate.

Specifically, Low Temperature Co-fired Ceramic (LTCC) generally gives an excellent high-frequency characteristic (lower dielectric constant and lower resistance) and a dimensional accuracy in comparison with the alumina ceramics widely used, and makes such a package and substrate material that meet the requirement for the high-frequency band width of the electronic devices and their miniaturization-oriented design specifications, and thus, is suitable for the substrate material in the present invention.

Specifically, LTCC easily realizes the control of the contraction coefficiency with a high degree of accuracy, and a fine line defined as Line & Space of the electric conductor pattern, L/S=40/40 μm, which is proved to have a high accuracy of finishing.

As for the production method of the dielectric resonator 1, a solid solution of dielectric material is printed and burned on the hole part 2 of the second dielectric layer 3. In this process, as the allowable error in the coefficient of contraction when burning the dielectric material is ±0.1%, the geometrical accuracy for the shape of the dielectric resonator 1 obtained only by processing precisely the mask or the cutting die used for defining the shape of the hole part 2 of the second dielectric layer 3 becomes within ±0.1% with respect to its design value, and the mounting accuracy in mounting the dielectric layer onto the high-frequency transmission line 4 becomes within ±5% with respect to the size of the resonator. Thus, according to the present invention, it will be appreciated that the mass production of the external resonators is made possible, which leads to extremely high productivity.

As for another production method of the dielectric resonator 1, the adhesive agent with its relative dielectric constant being 10 or smaller is made coated in the hole part 2 of the second dielectric layer 3, and then the solid dielectric resonator 1 is made mounted followed by the hardening process of the adhesive agent. In this case, though it is required to establish the geometrical accuracy in the shape of the dielectric resonator 1 independently, the mounting accuracy in mounting the dielectric layer onto the high-frequency transmission line 4 becomes within ±5% with respect to the size of the resonator. Thus, it will be also appreciated in this method that the mass production of the external resonators is made possible, which leads to extremely high productivity.

Figure 2:
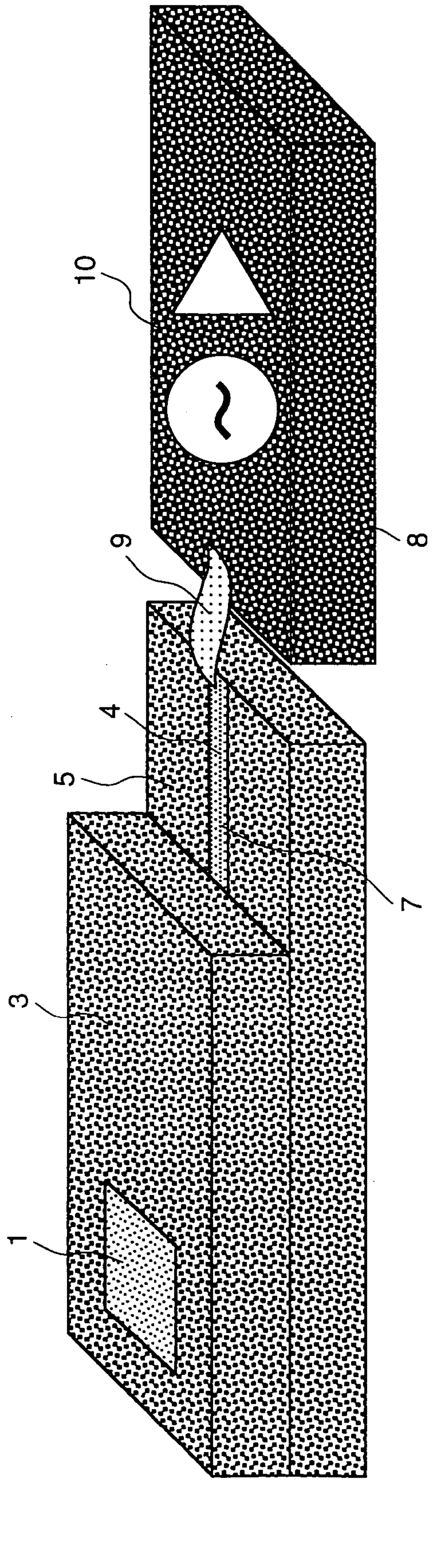
FIG. 2 is a perspective view illustrating the outline of the first embodiment of the mounting structure of the oscillator using the external resonator shown in FIG. 1.

Now, referring to FIG. 2, the first embodiment of the mounting structure of the oscillator using the external resonator shown in FIG. 1.

The second dielectric layer 3 is made laminated on the first dielectric layer 5. At this point, a part of the first dielectric layer 5 extends in the side direction to the second dielectric layer 3. A part of the transmission lie 4 is exposed above the surface of this laminated layer forms the first micro-strip transmission line 7. MMIC 10 as a component of the oscillator forms the second micro-strip transmission line 8. According to this configuration, the first micro-strip transmission line 7 and the second micro-strip transmission line 8 can be connected to each other by Au ribbon line 9 or Au line and the like.

Figure 3:
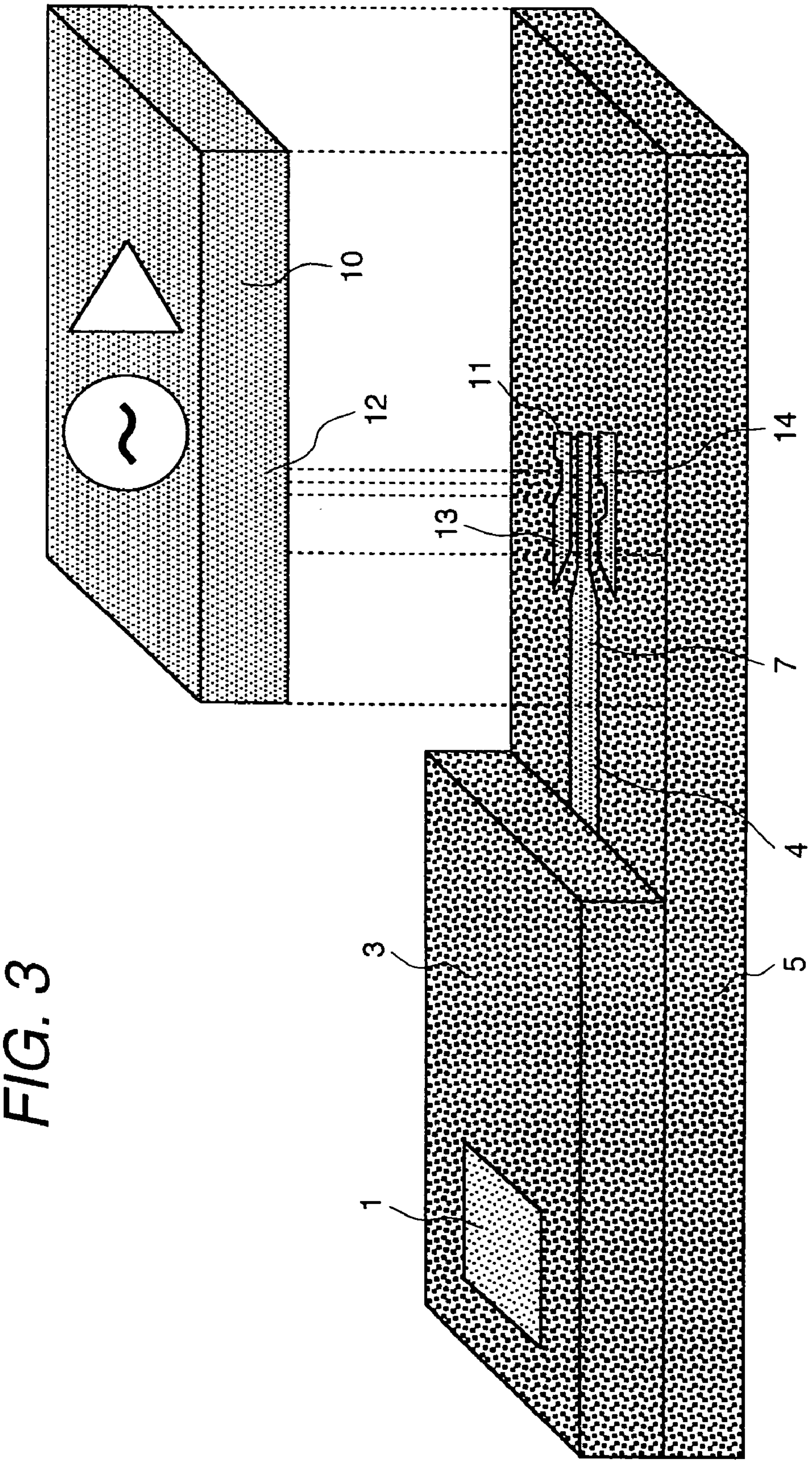
FIG. 3 is a perspective view illustrating the outline of another embodiment of the mounting structure of the oscillator using the external resonator shown in FIG. 1.

Now, referring to FIG. 3, another embodiment of the mounting structure of the oscillator using the external resonator shown in FIG. 1.

The second dielectric layer 3 is made laminated on the first dielectric layer 5. At this point, a part of the first dielectric layer 5 extends in the side direction to the second dielectric layer 3, and thus the transmission lie 4 is exposed above the surface of this laminated layer, which forms the first micro-strip transmission line 7. The first micro-strip transmission line 7 is converted by the conversion part 13 to the first coplanar transmission line 11. MMIC 10 as a component of the oscillator forms the second micro-strip transmission line 12. According to this configuration, the first coplanar transmission line 11 and the second coplanar transmission line 12 can be connected by the solder bump 14 or Au pillar and the like.

In the embodiment of the present invention, the relative position between the dielectric resonator 1 and the high-frequency transmission line 4 or the micro-strip transmission line 7 becomes important. In order to consider this relative position, for example, a cavity used for mounting the dielectric resonator 1 into the unprocessed sheet is made formed in the green sheet in advance by the process based on the high-precision lamination method. In addition, the high-frequency transmission line 4 or the micro-strip line 7 to be coupled electro-magnetically to the dielectric resonator 1 can be positioned and formed on another green sheet with a high degree of accuracy. As the relative position between a couple of those sheets can be defined with a high degree of accuracy by the green sheet positioning part, the relative position between the dielectric resonator 1 and the high-frequency transmission line 4 or the micro-strip transmission line 7 can be established to be highly accurate. It will be also appreciated that the mass production of the external resonators is made possible, which leads to extremely high productivity.

The high-frequency module is composed of the antenna, the oscillator shown in FIG. 2 or 3 and the rid. In the following, one embodiment of the high-frequency module using the external oscillator in one embodiment of the present invention will be described.

Figure 4:
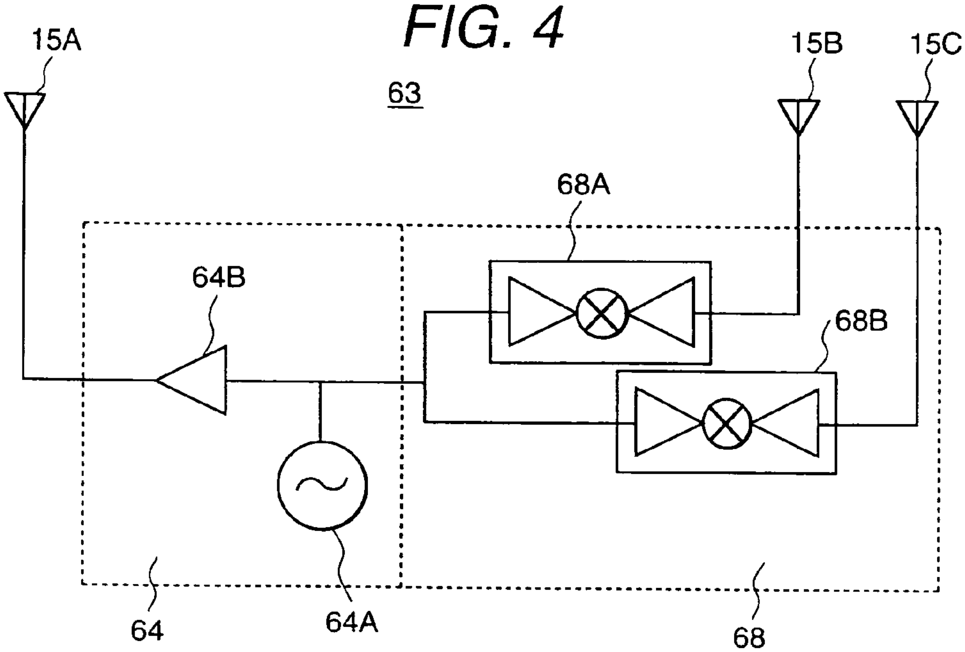
FIG. 4 is a perspective view illustrating an example of the circuit configuration of the high-frequency module for the Doppler radar for the vehicle, applying the present invention.

At first, referring to FIG. 4, an example of the circuit configuration of the high-frequency module for the Doppler radar of the vehicle applying the present invention.

The high-frequency module 63 has the transmitting function part 64 and the receiving function part 68. The transmission function part 64 has the oscillator 64A composed of the external oscillator land MMIC 10, and amplifies the high-frequency signal put out from this oscillator with the amplifier 64B, and then outputs the transmission signal from the transmitting antenna 15A to the free space ahead of the vehicle. The receiving function part 68 converts down the output signal from the oscillator 64A with the down-converters 68A and 68B of the receiver 68, and extracts the Doppler signal. It is allowed that the amplifier 64B is composed of a part of MMIC 10.

Figure 5:
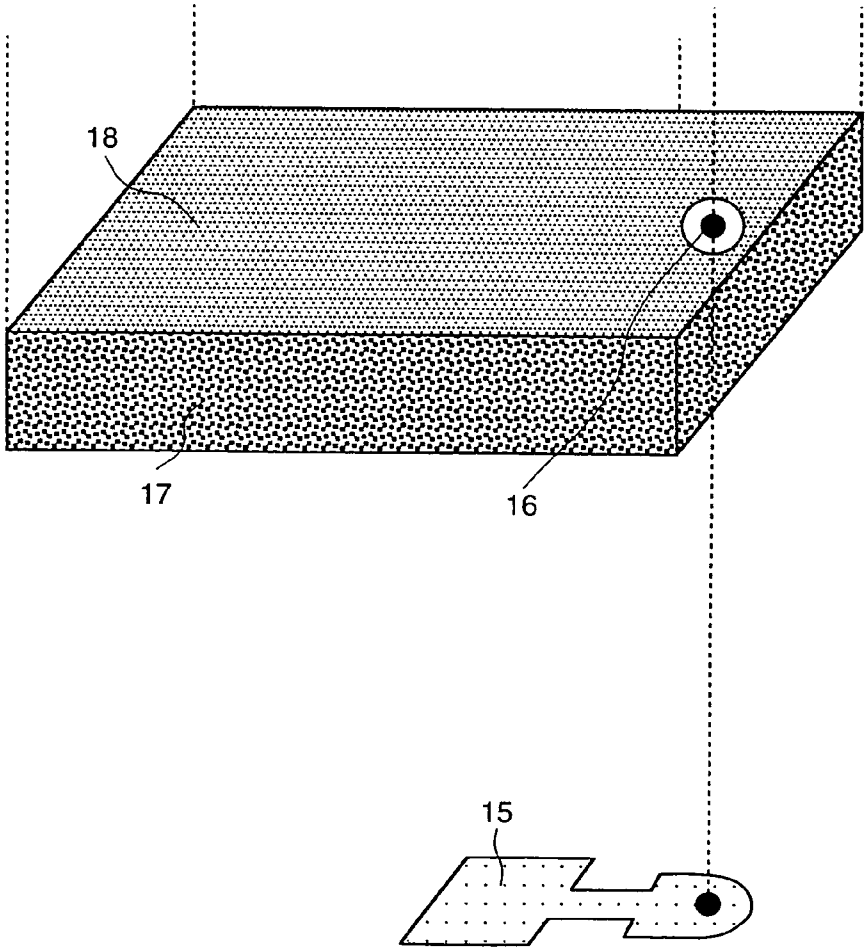
FIG. 5 is a partial perspective view of the lower part of the transmission function part of the high-frequency module according to one embodiment of the present invention.
Figure 6:
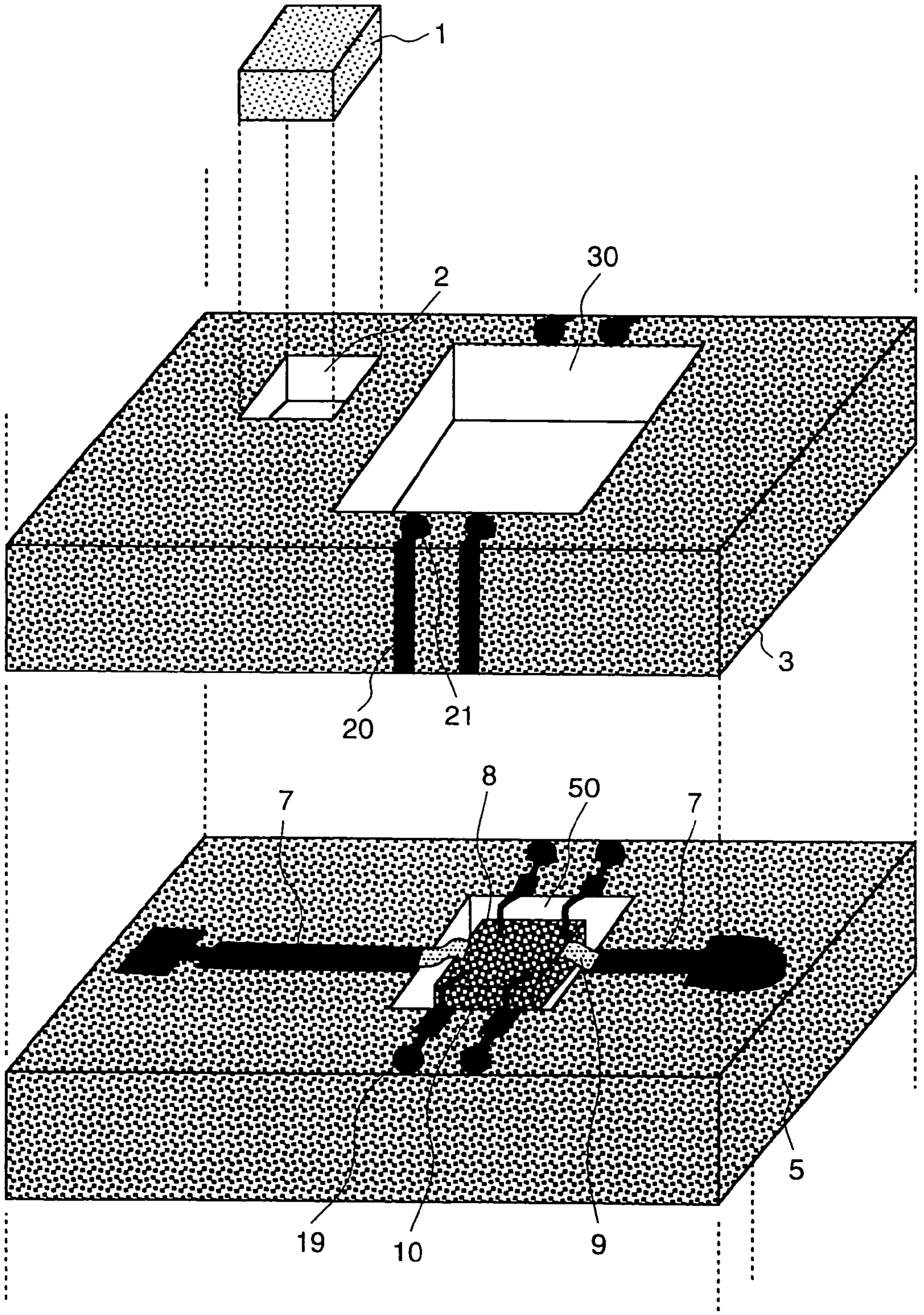
FIG. 6 is a partial perspective view of the intermediate part of the transmission function part of the high-frequency module according to one embodiment of the present invention.
Figure 7:
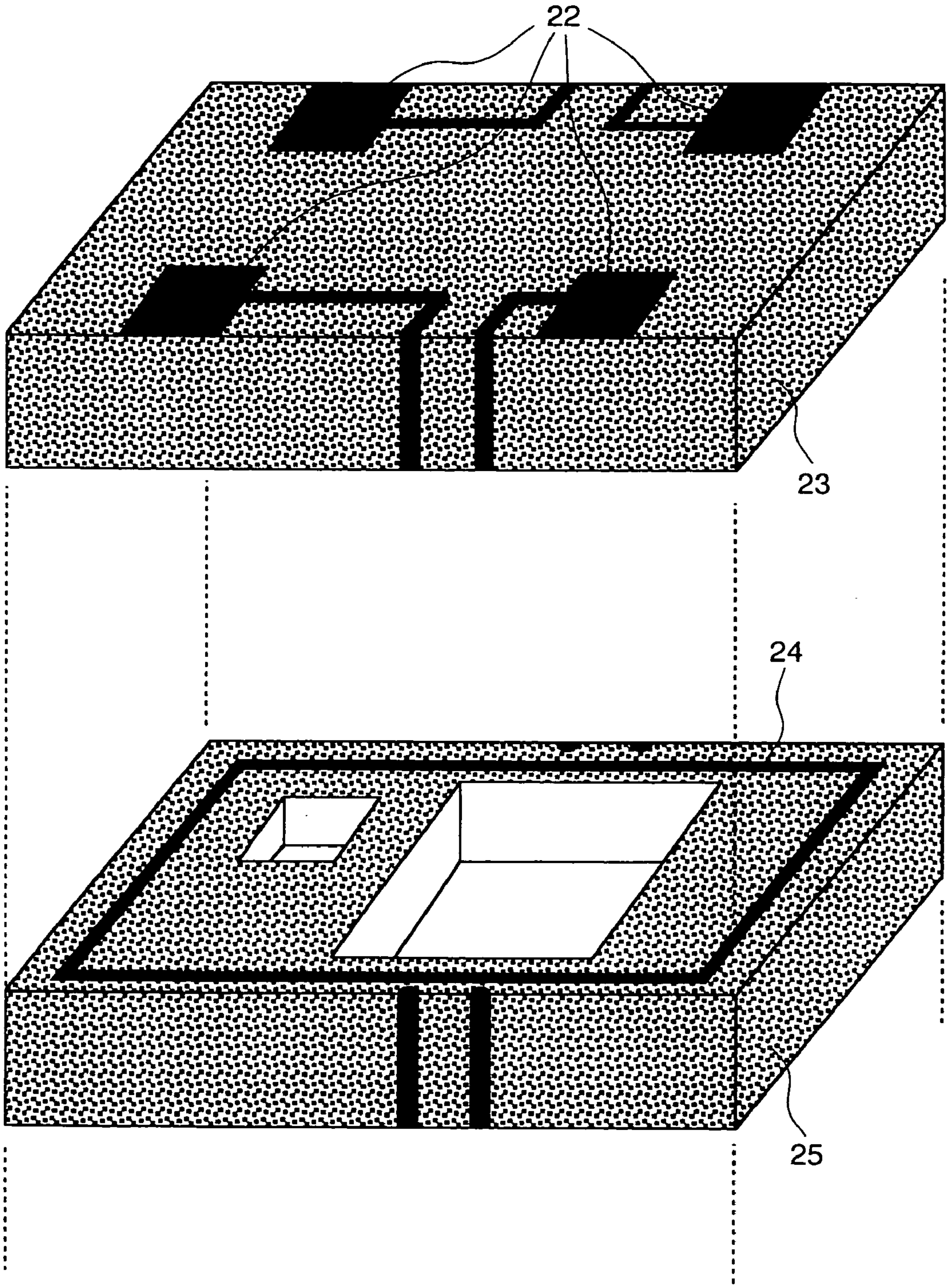
FIG. 7 is a partial perspective view of the upper part of the transmission function part of the high-frequency module according to one embodiment of the present invention.

Next, referring to FIGS. 5 to 7, the first embodiment of the mounting method of the high-frequency module 63 including the transmitting function part having the structure in the embodiment shown by FIG. 2 is described.

FIGS. 5 to 7 are exploded perspective views of the transmitting function part of the high-frequency module based on the embodiment of the present invention. FIG. 5 illustrates the lower part of the transmitting function part, that is, the third dielectric layer 17, FIG. 6 illustrates the intermediate part of the transmitting function part, that is, the first dielectric layer 5 and the second dielectric layer 5 above the first dielectric layer, and FIG. 7 illustrates the upper part of the transmitting function part, that is, the forth dielectric layer 25 and the rid 23 above the forth dielectric layer.

As for the production process of the high-frequency module, the dielectric layer 17, the first dielectric layer 5, the second dielectric layer 3, the forth dielectric layer 25 and the rid 23 are individually fabricated by the process based on the lamination method, and then those components are made laminated one by one from bottom to top in order to obtain a single body.

The antenna pattern 15 is formed below the transmitting function part in FIG. 5. GND layer 18 is formed on one side of the third dielectric layer 17, and the antenna pattern 15 defining the transmitting antenna 15A and the receiving antennas 15B and 15C are formed on the other side. The antenna pattern 15 is formed by multi-layered metals such as Ag/Pd, Ag, Au, Ag/Pt and the like, and connected to the through via 16 to be used as the feeding point. The through via 16 is formed by Ag/Pd, Ag, Au, Ag/Pt and the like, and penetrates through the third dielectric layer 17 and the first dielectric layer 5, and then, is made connected to the first micro-strip transmission line 7 formed on the first dielectric layer 5.

And furthermore, on the other side of the surface of the third dielectric layer 17 on which antenna pattern 15 is defined, the circumference area of the through via 16 is adjusted so that its characteristic impedance maybe 50, and GND layer 18 is formed with Ag/Pd, Ag, Au, Ag/Pt and the like on the whole area other than the circumference area of the through via 16.

Next, referring to FIG. 6, the intermediate part of the transmitting function part, that is, the oscillator part is described.

The hole part 50 formed in the first dielectric layer 5, that is, its mounting port of MMIC 10 is smaller than the hole part 30 formed in the second dielectric layer 3, that is, its mounting port of MMIC 10, and consequently, a part of the first micro-strip transmission line 7 formed in the first dielectric layer 5 is exposed to the hole part 30 formed in the second dielectric layer 3.

The second micro-strip transmission line 8 is formed in MMIC 10 as a component of the oscillator, and is die-bonded on GND layer l8 of the third dielectric layer l7 with the electrically conductive adhesive agent and the like. At this point, GND layer below MMIC 10 and GND layer 18 are connected electrically the first micro-strip transmission line 7 and the second micro-strip transmission line 8 are connected to each other by Au ribbon line 9 or Au line and the like. The hole part 2 is made formed in the second dielectric layer 3, and then the dielectric resonator 1 is mounted inside the hole part 2. In addition, the power and signal line 19 is made formed on the first dielectric layer 5, and the electrode is defined at the side edge of the second dielectric layer 3, which is extracted through the through via 21 formed in the second dielectric layer 3.

Next, the upper part of the transmitting function part, that is, the forth dielectric layer 25 in FIG. 7 is the dielectric material with its dielectric constant being 10 or smaller, and the through via 21 used for extending the electrode 20 at the side edge of the second dielectric layer 3 and the rid coupling pattern 24 are formed in the forth dielectric layer with Ag/Pd, Ag, Au, Ag/Pt and the like. In addition, the forth dielectric layer 25 has the open port 40 formed above the component 10 and the open port 42 formed above the dielectric resonator 1.

Next, the rid 23 is described.

The rid 23 is composed of the dielectric material with its dielectric constant being 10 or smaller, and has the through via 21 for extending the electrode 20 from the side edge of the second dielectric layer 3 and the coupling pattern opposed to the rid coupling pattern 24 of the forth dielectric layer 25, and the external electrode 22 to be connected to the electrode 20 on the side edge of the second dielectric layer 3 is formed on the surface opposed to the rid coupling pattern 24.

As the dielectric materials with their dielectric constant being different from one another can be processed individually by the printing method or the lamination method or by their combined method, it will be appreciated that the high-frequency circuit can be produced simply and with low cost and that this production method can be proved to be an excellent method.

As plural frequency modules can be formed on a single green sheet in the production process using the lamination method, the number of steps for positioning the green sheets can be made smaller in comparison with the conventional method in which the positioning step is repeated for forming the individual high-frequency module, which leads to an extremely high productivity.

The effect similar to that described above can be obtained for the high-frequency module formed with the oscillator having the structure shown in FIG. 3 and the external resonator.

Figure 8:
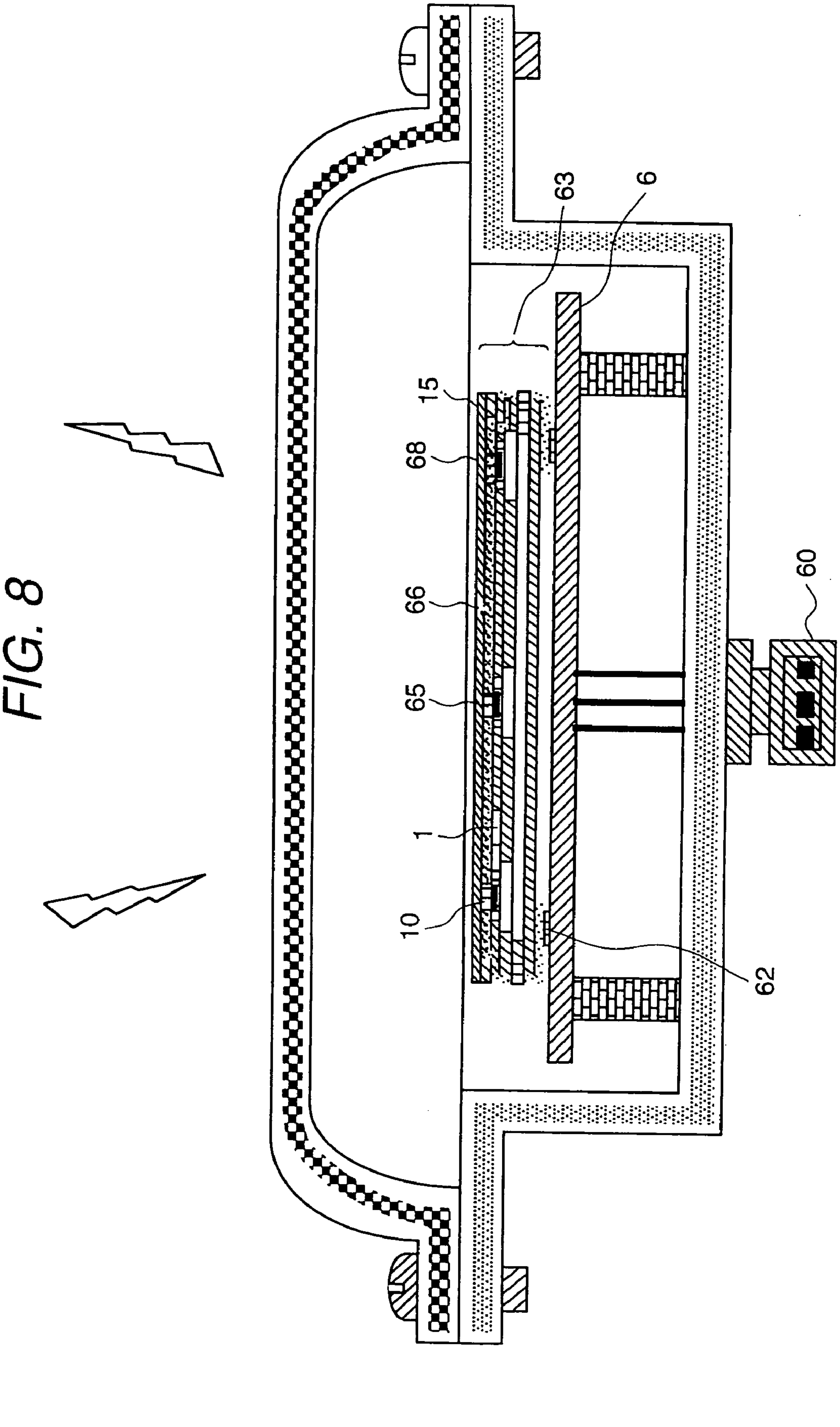
FIG. 8 is a vertical cross-section view illustrating one embodiment of the on-vehicle radar using the high-frequency module shown in FIG. 5 to FIG. 8.
Figure 9:
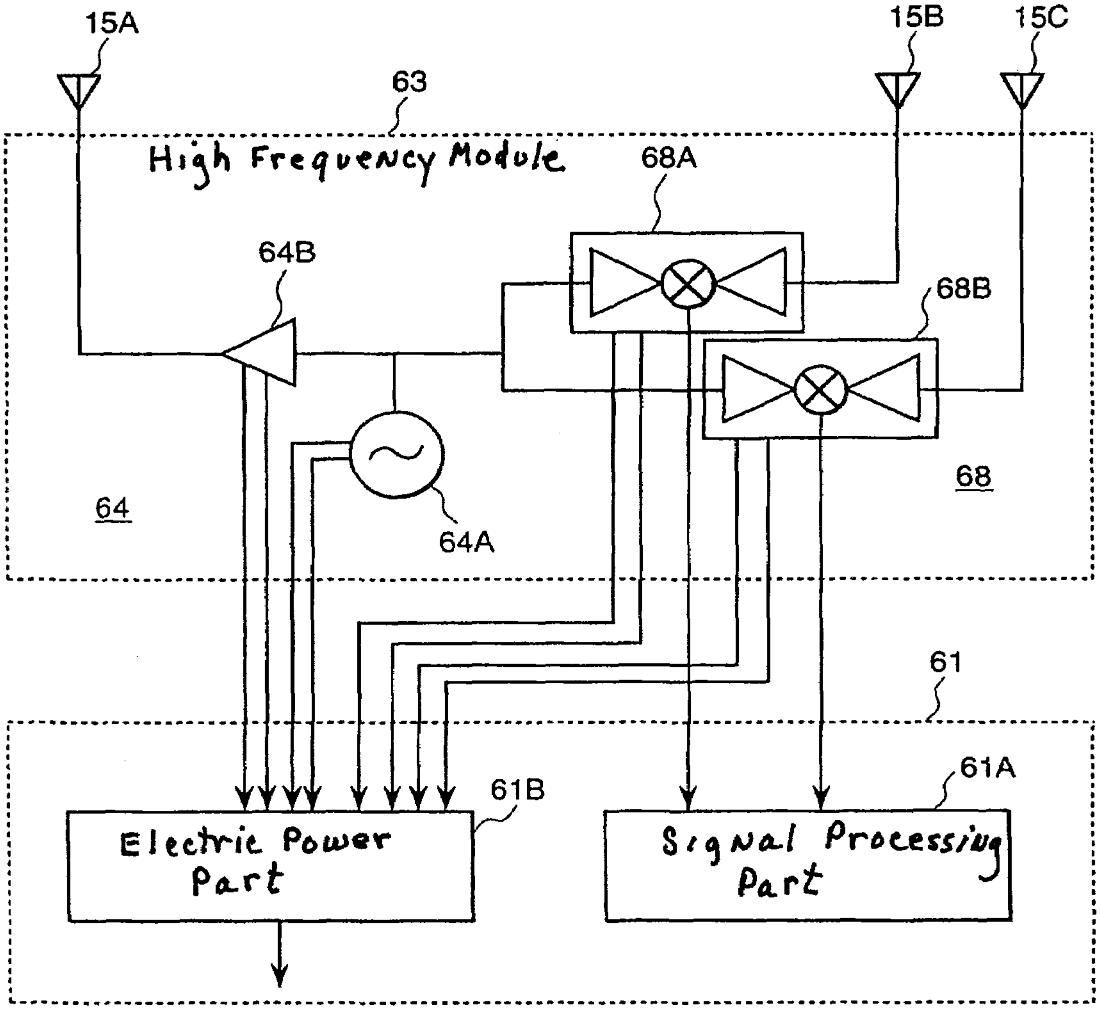
FIG. 9 is a circuit diagram of the on-vehicle radar shown in FIG. 8.

Next, referring to FIGS. 8 and 9, one embodiment of the on-vehicle radar using the above described high-frequency module is described. FIG. 8 is a vertical cross-section view of the on-vehicle radar, and FIG. 9 is a circuit diagram of the on-vehicle radar.

The on-vehicle radar is composed of the signal processing circuit 61, the high-frequency module 63 and the antenna 15. The electric power is supplied to the signal processing circuit 61 through the connector 60, and the signal processing circuit 61 supplies simultaneously the designated electric power to the high-frequency module 63 through the solder bump 62.

The high-frequency module 63 has the oscillator 64A composed of the external resonator 1 and MMIC 10, and MMIC 10 generates an extremely high frequency wave in 76 GHz, and this extremely high frequency wave is amplified by MMIC 65 as a part of the amplifier and then supplied to the antenna 15A through the feeding point 66. The extremely high frequency wave is transmitted to the free space ahead of the vehicle.

On the other hand, the receiving antennas 15B and 15C receives the reflected wave traveling after the reflection at the target object. The received signal is made mixed with the transmit signal at MMIC 68 as a part of the receiver, and is made transferred as IF signal to the signal processing circuit 61 through the solder sump 62, and then the signal processing part 61A (referring to FIG. 9) calculates the information for the relative speed, the relative distance and relative angle between the vehicle having the radar and the target object by the signal processing based on various algorithms. Those calculation results are output at the connector 60. The electric power part 61B supplies the bias voltage to the individual MMIC's of the high-frequency module 63.

The accuracy in the information for relative speed, the relative distance and relative angle obtained by the signal processing part 61A depends upon the Q factor of the oscillator. This Q factor is determined by the material Q factor of the dielectric resonator 1 of the external resonator and the relative position between the dielectric resonator 1 and the high-frequency transmission line 4 or the micro-strip transmission line 7.

According to the present invention, as the high-frequency circuit having an advantageous aspect in positioning of the dielectric resonator 1 and the high-frequency transmission line or the micro-strip transmission line can be produced simply and with low cost, it will be appreciated that high-precision and low-price on-vehicle radars can be provided.

According to the present invention, as the positioning between the dielectric layer composing the oscillator and the high-frequency transmission line can be established with a high degree of accuracy, it will be appreciated that the frequency characteristic of the oscillator can be stabilized. In addition, the high-precision high-frequency circuit can be produced simply and with low cost. Therefore, it will be appreciated that a high-precision and low-cost on-vehicle radar can be provided by applying those devices.

What is claimed is:

1. An on-vehicle radar comprising a signal processing circuit, a high-frequency module and an antenna; wherein:

said high-frequency module has an oscillator that includes an external resonator and an MMIC that generates an extremely high frequency wave which is amplified and transmitted from said antenna to a free space ahead of a vehicle;

said oscillator has a substrate that includes a high-frequency transmission line and a dielectric resonator that is mounted in said substrate and is coupled electro-magnetically to said high-frequency transmission line;

said substrate is composed of a dielectric material;

a recess comprising one of a hole and a cavity is formed at a part of said substrate; and said dielectric resonator is mounted in said recess.

2. A method of producing a high-frequency semiconductor device that includes a substrate having a high-frequency transmission line and a dielectric resonator that is mounted in said substrate and is coupled electro-magnetically to said high-frequency transmission line, said method comprising:

forming said high-frequency transmission line on said substrate, said substrate being composed of a dielectric material;

forming a recess comprising one of a hole or a cavity in said substrate, at a position that is suitable for electro-magnetically coupling said dielectric resonator to said high-frequency transmission line; and mounting said dielectric resonator in said recess.

3. The method according to claim 2, wherein said substrate is produced by a printing method.

4. The method according to claim 3, wherein:

said recess is formed in a dielectric layer that composes said substrate, by a tool selected from the group consisting of a mask and a cutting die; and a solid solution of a dielectric material having a dielectric constant higher than that of a dielectric material used in said substrate is printed and burned on said hole part or said cavity part.

5. The method according to claim 3, wherein:

said recess is formed in a dielectric layer that composes said substrate, by a tool that is selected from the group consisting of a mask and a cutting die; and an adhesive agent is coated in said recess;

a dielectric resonator having a dielectric constant higher than a dielectric constant of a dielectric material used for said substrate is mounted in said recess; and said adhesive agent is then hardened.

6. The method according to claim 2, wherein said substrate is produced by a lamination method.

* * * * *